United States Patent [19]
Sasaki

[11] Patent Number: 5,146,506
[45] Date of Patent: Sep. 8, 1992

[54] ISOLATOR CIRCUIT FOR AN AUDIO SYSTEM

[75] Inventor: Yoshio Sasaki, Saitama, Japan

[73] Assignee: Pioneer Electronic Corporation, Tokyo, Japan

[21] Appl. No.: 706,697

[22] Filed: May 29, 1991

[30] Foreign Application Priority Data

Oct. 25, 1990 [JP] Japan ................. 2-287989

[51] Int. Cl.⁵ ............ H04R 3/00; H03G 5/00; H03H 7/00; H04B 15/00
[52] U.S. Cl. ............ 381/94; 381/96; 381/100; 333/172
[58] Field of Search ........... 381/28, 120, 100, 96, 381/94; 307/520, 521; 328/127, 167; 333/172

[56] References Cited

U.S. PATENT DOCUMENTS

| | | | |
|---|---|---|---|
| 3,579,125 | 5/1971 | Lindblad | 328/127 |
| 3,889,136 | 6/1975 | Mohan et al. | 307/521 |
| 4,321,428 | 3/1982 | Seki | 381/120 |
| 4,507,578 | 3/1985 | Matsuda | 307/520 |

FOREIGN PATENT DOCUMENTS 58-124315A 7/1983 Japan .................. 381/100

Primary Examiner—James L. Dwyer
Assistant Examiner—Jack Chiang
Attorney, Agent, or Firm—Nikaido, Marmelstein, Murray & Oram

[57] ABSTRACT

An isolator circuit for an audio system has an operational amplifier provided between a signal source and an amplifier. A capacitor and a resistor connected in series are connected between each input of the operational amplifier and the signal source. A buffer amplifier is provided between the capacitor and the resistor of each input line of the operational amplifier.

1 Claim, 9 Drawing Sheets

ISOLATOR CIRCUIT FOR AN AUDIO SYSTEM

BACKGROUND OF THE INVENTION

The present invention relates to an audio system mounted on a motor vehicle, and more particularly to an isolator circuit provided in the system for eliminating noise entering the system.

FIG. 6 shows an electric circuit of a conventional sound-reproduction system such as a CD player mounted on a motor vehicle. In the system, a signal source A is connected to an amplifier B through shielding wires L1 and L2. If an impedance exists in the ground wire L2, currents dependent on various types of noise radiated from the alternator, the ignition system and the horn of the motor vehicle enter the ground wire L2. As a result noise voltage en enters into an output signal (source signal) of the signal source A in series between an output EOUT of the signal source A and an input EIN of the amplifier B. The noise voltage en is amplified by the amplifier B which results in the production of unwanted sound from a loudspeaker (not shown).

In order to eliminate such noise, the conventional sound-reproduction system is provided with an isolator circuit as shown in FIG. 7 between the output EOUT and the input EIN of the signal source A and the amplifier B.

The isolator circuit includes an operational amplifier 1, capacitors C1, C2 and C4 and resistors R1, R2, R3 and R4. An output terminal E1 of the signal source A is connected to an inverting input of the operational amplifier 1 through the capacitor C1 and the resistor R1. Another output terminal E2 of the signal source A is connected to a noninverting input of the operational amplifier 1 through the capacitor C2 and the resistor R3. An output of the operational amplifier 1 is connected to an input terminal E3 of the amplifier B and to the inverting input of the amplifier 1 through the resistor R2. Between the resistor R3 and the noninverting input of the operational amplifier 1, another input terminal E4 of the amplifier B is connected through the capacitor C4 and the resistor R4. The input terminal E4 is connected to the ground. Resistance R5 has a large valve as a reference voltage.

In such an isolator circuit, if a noise voltage en1 is produced between terminals E5 and E6 of the grounds of the signal source A and the amplifier B, the noise voltage en1 is added to a voltage en2 of an audio signal of the signal source A, if the ground terminal E5 is regarded as a reference. Thus, the voltage en1+en2 is applied to the inverting input of the operational amplifier 1.

If the impedance of the audio signal source of voltage en2 is sufficiently small, gain G1 of the operational amplifier 1 as viewed from the inverting input is represented as $$G1 = R2/R1$$

Consequently, the output Op1 of the operational amplifier 1 is $$Op1 = -(en1+en2)$$

Thus, the noise is represented as $-en1 \cdot R2/R1$.

On the other hand, gain G2 of the operational amplifier 1 as viewed from the noninverting input is represented as $$G2 = (R1+R2)/R1$$

Since the noise voltage en1 is divided by resistors R3 and R4 and applied to the noninverting input, the output Op2 of the operational amplifier is represented as $$Op2 = en1 \cdot (R1+R2)/R1 \cdot R4/(R3+R4)$$

In order to cancel the noise voltage en1 from the output of the operational amplifier 1, the output Op2 must be equal to the noise $-en1 \cdot R2/R1$ of the output Op1.

Consequently, $$-en1 \cdot R2/R1 = en1 \cdot (R1+R2)/R1 \cdot R4/(R3+R4),$$

$$R2/R1 = R3/R4$$

Thus, the common-mode noises caused by the alternator, ignition system, horn and others are suppressed.

FIGS. 8 and 9 show examples of the conventional isolator circuit. In the isolator circuit of FIG. 8, the output signal from the signal source A is applied to the inverting input of the operational amplifier 1. In FIG. 9, the output signal is applied to the noninverting input thereof. FIG. 10 is a graph of frequency responses of these circuits, in which the line a represents the characteristic of FIG. 8 and the line b shows the characteristic of FIG. 9.

The cutoff frequency of the circuit of FIG. 8 is determined by resistors and capacitors. The cutoff frequency of the circuit of FIG. 9 is determined by the product of resistors and capacitors. The cutoff frequency is frequency below which the output becomes smaller than $-3dB$.

Namely, the cutoff frequency of the line a is about 100 Hz and the cutoff frequency of the line b is about 200 Hz. As seen from the graph, the characteristics of both circuits are inferior in a low frequency range. In other words, the circuits can not remove noises in the low frequency range.

SUMMARY OF THE INVENTION

The object of the present invention is to provide an isolator circuit having a flat characteristic which may remove noise in a wide frequency range.

According to the present invention, there is provided an isolator circuit for an audio system having an operational amplifier provided between a signal source and an amplifier, each input of the operational amplifier being connected to the signal source through a capacitor and a resistor connected in series. The circuit incorporates a buffer amplifier provided between the capacitor and the resistor of each input line of the operational amplifier.

In one aspect of the invention, the buffer amplifier has a high input impedance and a low output impedance.

In another aspect, the present invention provides an isolator circuit for an audio system having an operational amplifier provided between a signal source and an amplifier, the operational amplifier having an inverting input and a noninverting input. The isolator circuit includes first capacitor and a first resistor connected in series between the signal source and one of the inputs of the operational amplifier, a first buffer amplifier provided between the first capacitor and the first resistor, a second capacitor and a second resistor connected in series between a ground and the other input of the operational amplifier, a second buffer amplifier provided between the second capacitor and the second resistor, a third capacitor and a third resistor connected in series between the ground and the noninverting input of the operational amplifier, and a third buffer amplifier provided between the second capacitor and the second resistor.

Other objects and features of this invention will become understood from the following description with reference to the accompanying drawings.

DETAILED DESCRIPTION OF THE PREFERRED EMBODIMENTS

Figure 1:
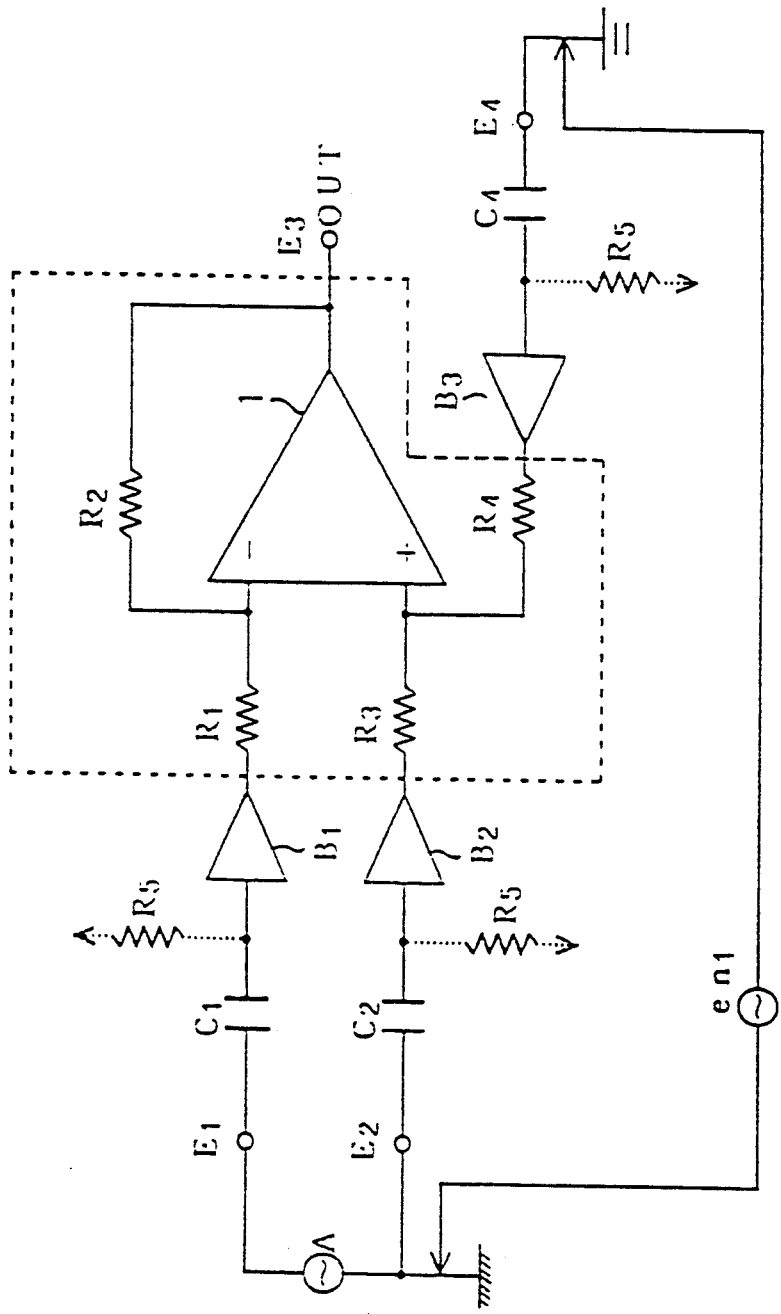
FIG. 1 is a schematic diagram showing an isolator circuit for a sound-reproduction system according to the present invention.
Figure 6:
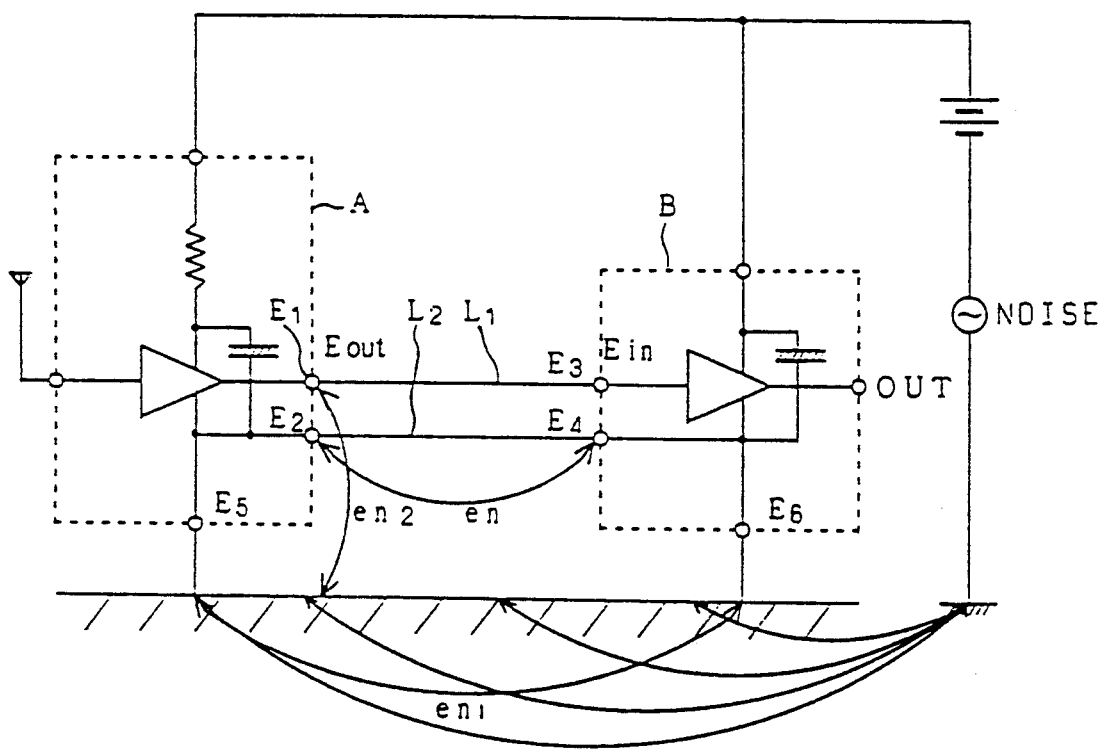
FIG. 6 is a schematic diagram showing a circuit of a conventional sound-reproduction system.
Figure 7:
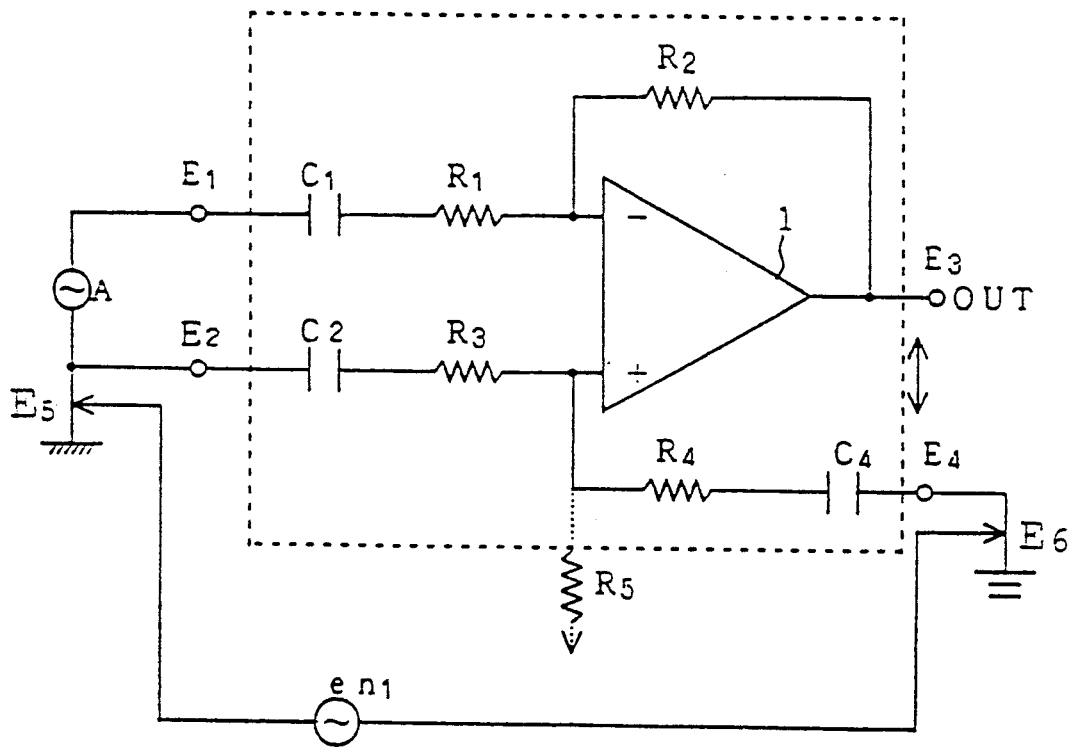
FIG. 7 is a schematic diagram showing a conventional isolator circuit.
Figure 8:
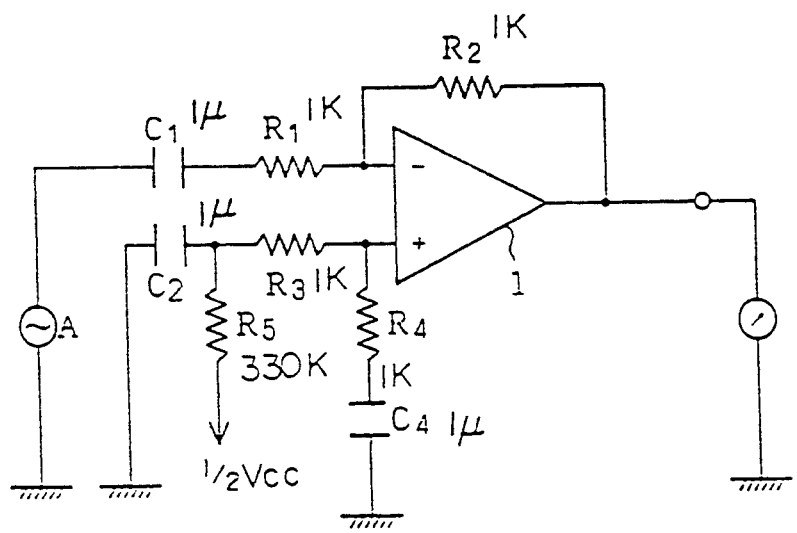
FIGS. 8 and 9 are circuits showing examples of the conventional isolator circuit.
Figure 9:
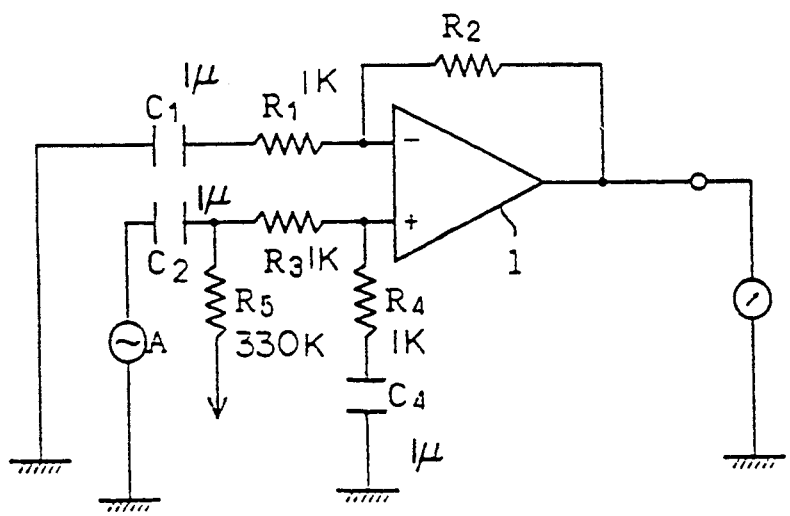
Figure 10:
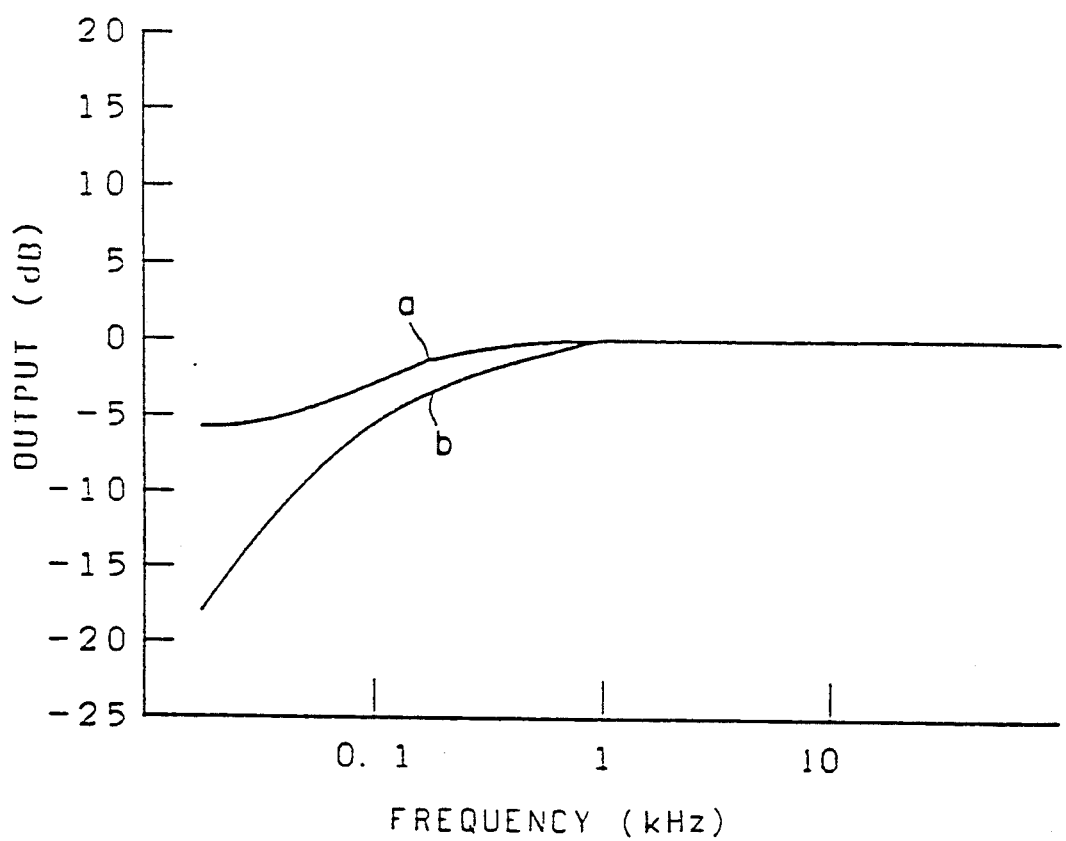
FIG. 10 is a graph showing frequency responses of the conventional isolator circuits of FIGS. 8 and 9.

Referring to FIG. 1 showing an isolator circuit of the present invention, the parts which are the same as the conventional isolator circuit are identified with the same reference numerals as FIGS. 6 and 7.

The isolator circuit incorporates comprises the operational amplifier 1 and resistors R1 to R4. A buffer amplifier B1 is provided between the capacitor C1 and the resistor R1, and another buffer amplifier B2 is provided between the capacitor C2 and the resistor R3. A buffer amplifier B3 is provided between the capacitor C4 and the resistor R4. Each of the buffer amplifiers B1 to B3 has a high input impedance and a low output impedance.

Figure 2:
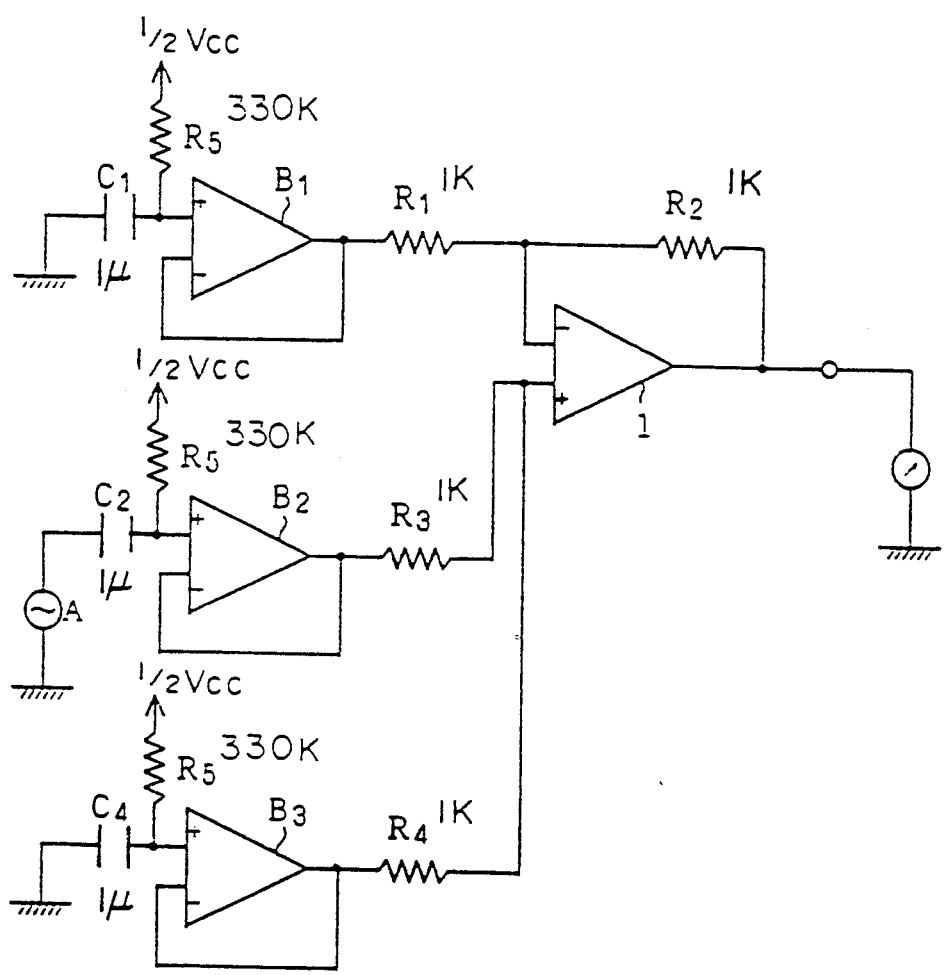
FIG. 2 is a circuit showing the isolator circuit of FIG. 1.

Referring to FIG. 2 showing an embodiment of the isolator circuit, the output signal of the signal source A is applied to the noninverting input of the operational amplifier 1 through the buffer amplifier B2.

The audio signal of the signal source A is applied to a noninverting input of the buffer amplifier B2 through the capacitor C2. A feedback signal of the buffer amplifier B2 is applied to an inverting input thereof. The buffer amplifier B2 amplifies the difference between the audio signal and the feedback signal. The amplified differential signal is applied to the noninverting input of the operational amplifier 1 through the resistor R3. An amplified differential signal from the buffer amplifier B3 is applied to the noninverting input of the amplifier 1 through the resistor R4. The inverting input of the operational amplifier 1 is applied with the feedback signal of the output thereof through the resistor R2 and an amplified differential signal from the buffer amplifier B1 through the resistor R1.

In the embodiment, since the buffer amplifiers B2 and B3 are disposed between the capacitors C2 and C4 and the resistors R3 and R4, respectively, there is no cutoff frequency of the amplifier 1 determined by the resistors and capacitors.

Figure 3:
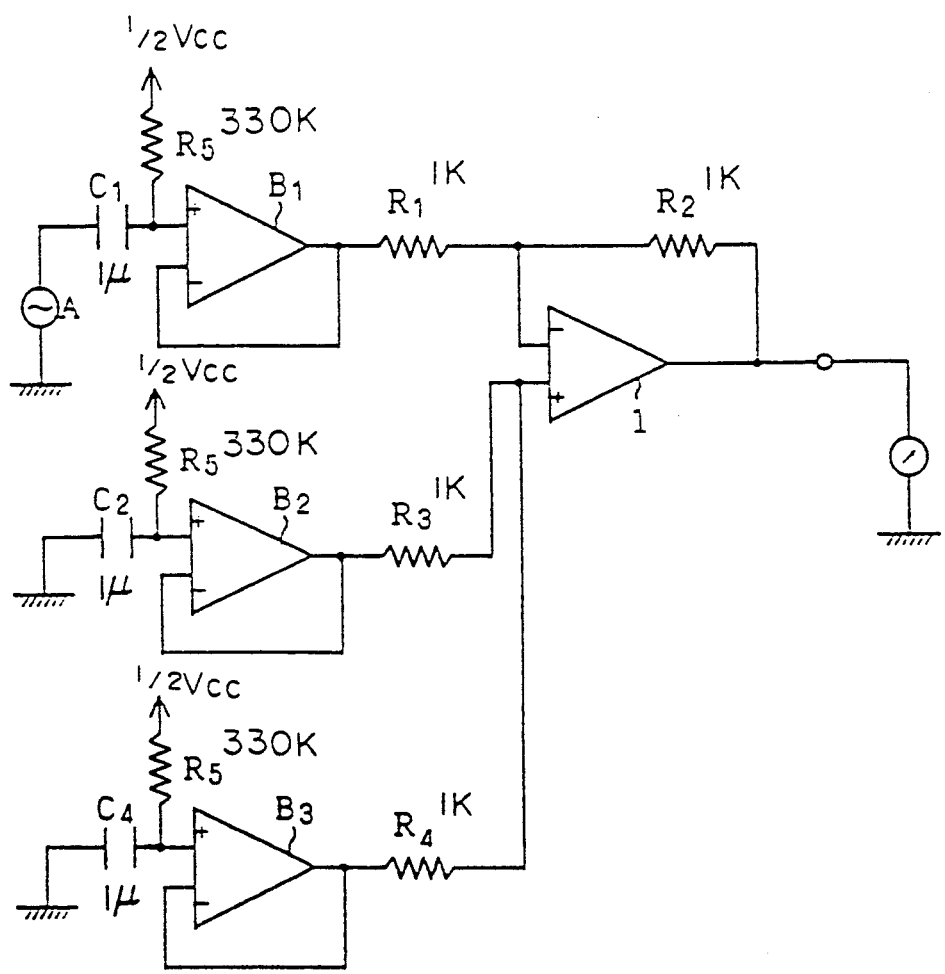
FIG. 3 is a circuit showing another embodiment of the present invention.

Referring to FIG. 3 showing another embodiment, the output signal of the signal source A is applied to the inverting input of the operational amplifier 1 through the buffer amplifier B1.

The audio signal is applied to a noninverting input of the buffer amplifier B1 through the capacitor C1. In the buffer amplifier B1, the difference between the audio signal and a feedback signal applied to an inverting input thereof is amplified. The amplified differential signal is applied to the inverting input of the amplifier 1 through the resistor R1. The noninverting input of the amplifier 1 is applied with differential signals of buffer amplifiers B2 and B3.

In the embodiment, the cutoff frequency of the operational amplifier 1 does not also appear.

Figure 4:
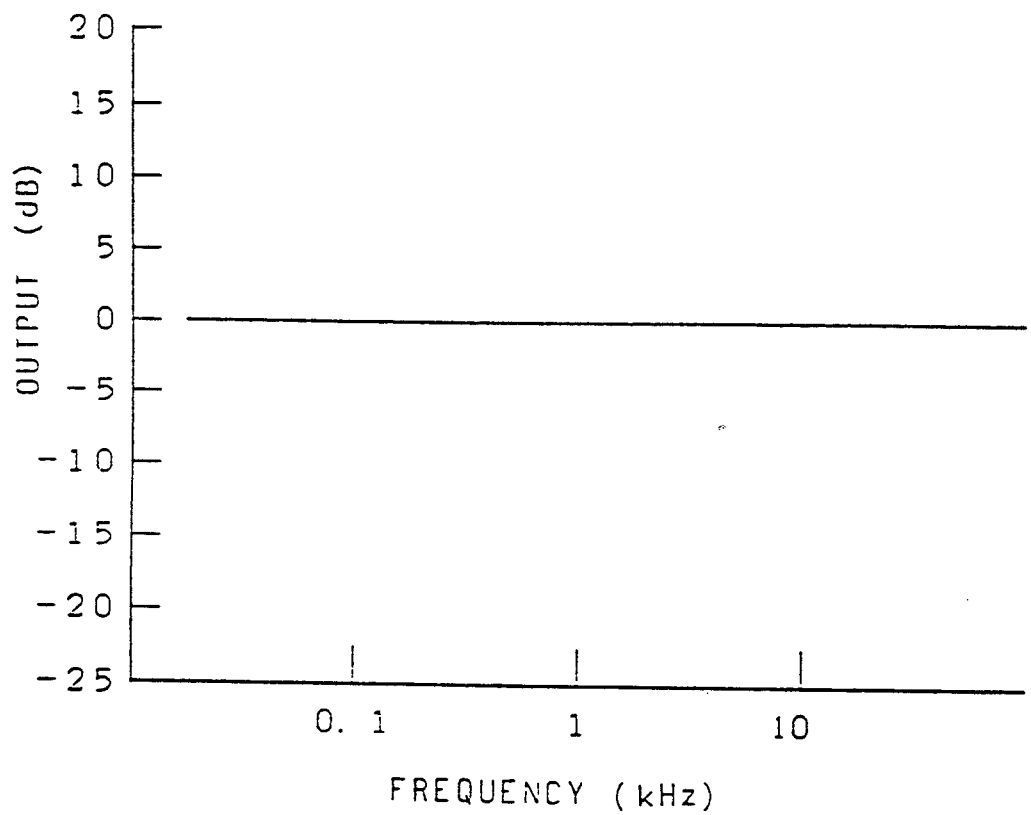
FIG. 4 is a graph showing a frequency response of the isolator circuit of the present invention.

Consequently, the frequency response of the amplifier 1 becomes flat in the entire range as shown in FIG. 4.

Further, the level of the common-mode noise can be reduced in accordance with the isolator circuit of the present invention.

Figure 5:
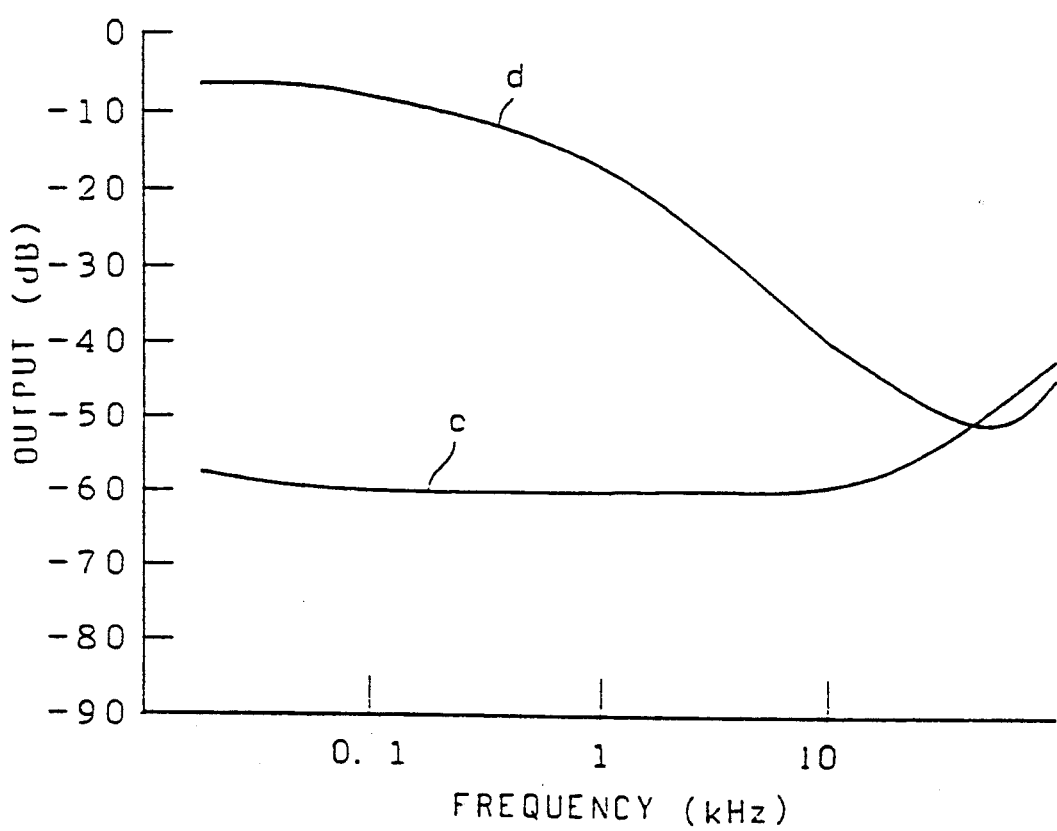
FIG. 5 is a graph showing characteristics of noise levels of the isolator circuit of the present invention and a conventional isolator circuit.

FIG. 5 shows the characteristics for the common-mode noise. A line C represents a characteristic of the isolator circuit of the present invention of FIG. 1 and a line d represents a characteristic of the conventional isolator circuit of FIG. 7.

It will be seen that the level of the common-mode noise shown by the line C is remarkably reduced in the middle and low ranges compared with the line d.

In accordance with the present invention, the buffer amplifier having a high input impedance and a low output impedance is connected to the input of the operational amplifier. Thus, if the output signal of the signal source is applied to either the inverting input or noninverting input, a flat characteristic can be obtained.

Further, imbalance of the ground levels between the output of the signal source and the input of the amplifier can be cancelled. The common-mode noise can be suppressed in the entire range.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. An isolator circuit for an audio system having an operational amplifier provided between a signal source and an output to an audio system amplifier, the operational amplifier having an inverting input and a noninverting input, comprising:
    a first capacitor and a first resistor connected in series between the signal source and one of the inputs of the operational amplifier;
    a first buffer amplifier provided between the first capacitor and the first resistor;
    a second capacitor and a second resistor connected in series between a ground and the other input of the operational amplifier;
    a second buffer amplifier provided between the second capacitor and the second resistor;
    a third capacitor and a third resistor connected in series between ground and the noninverting input of the operational amplifier; and
    a third buffer amplifier provided between the third capacitor and the third resistor.

* * * * *